(12) United States Patent
Steffensmeier et al.

(10) Patent No.: US 6,944,032 B1  
(45) Date of Patent: Sep. 13, 2005

(54) INTERCONNECT FOR FLAT PANEL DISPLAYS

(75) Inventors: Martin J. Steffensmeier, Cedar Rapids, IA (US); John K. Hagge, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 820 days.

(21) Appl. No.: 09/833,536

(22) Filed: Apr. 12, 2001

(51) Int. Cl.[7] ............................ H05K 1/11; H05K 1/14
(52) U.S. Cl. ....................... 361/803; 361/795; 313/504
(58) Field of Search ...................... 361/792–795, 361/803; 349/58, 149–153; 313/504–506

(56) References Cited

U.S. PATENT DOCUMENTS

| | | | |
|---|---|---|---|
| 4,577,133 A * | 3/1986 | Wilson ................. 313/103 CM |
| 4,690,510 A | 9/1987 | Takamatsu et al. ......... 399/178 |
| 5,353,138 A | 10/1994 | Van Winsum ............... 349/41 |
| 5,577,944 A | 11/1996 | Taylor ........................ 445/25 |
| 5,760,862 A | 6/1998 | Bachus ....................... 349/149 |
| 5,784,212 A * | 7/1998 | Hornbeck ................... 359/871 |
| 5,804,920 A * | 9/1998 | Khan et al. ................ 313/582 |
| 5,858,581 A | 1/1999 | Stephenson ................... 430/7 |
| 5,965,907 A | 10/1999 | Huang et al. ................ 257/89 |
| 5,990,994 A | 11/1999 | Stephenson ................. 349/106 |
| 5,991,000 A * | 11/1999 | Shimabukuro et al. ..... 349/155 |
| 6,025,952 A | 2/2000 | Stephenson ................. 359/254 |
| 6,040,069 A | 3/2000 | Lupo et al. ................. 428/690 |
| 6,091,475 A | 7/2000 | Ogino et al. ................ 349/149 |
| 6,140,766 A * | 10/2000 | Okada et al. ............... 313/506 |
| 6,255,772 B1 * | 7/2001 | Cathey et al. .............. 313/495 |

FOREIGN PATENT DOCUMENTS

| EP | 0014063 A1 | 8/1980 | ........... H01J 29/00 |
|---|---|---|---|
| EP | 0 932 073 A1 | 7/1999 | ......... G02F 1/1343 |

* cited by examiner

Primary Examiner—Randy Gibson  
Assistant Examiner—Tuan Dinh  
(74) Attorney, Agent, or Firm—Nathan O. Jensen; Kyle Eppele

(57) ABSTRACT

An interconnect for use with a pixel layer of a pixel web is provided, the interconnect including an interconnect substrate having a plurality of conductive leads and a plurality of contact vias formed on and extending from the interconnect substrate. The contact vias are formed in a predetermined pattern on the interconnect substrate and are in electrical communication with the conductive leads. The interconnect includes a patterned spacer of a thickness substantially equal to a height of the contact vias. The patterned spacer includes a plurality of through-holes also formed according to the predetermined pattern and having a dimension substantially equal to a dimension of the contact vias. The interconnect substrate and the patterned spacer are capable of being assembled onto the pixel layer, with the patterned spacer being in a middle position and the contact vias extending through the through-holes to contact corresponding cathode portions on the pixel layer.

14 Claims, 4 Drawing Sheets

INTERCONNECT FOR FLAT PANEL DISPLAYS

FIELD OF THE INVENTION

The present invention relates generally to an electrical interconnect, and more particularly to an electrical interconnect for a flat panel display.

BACKGROUND OF THE INVENTION

Electronic displays are widely used in many types of devices. Uses may include, for example, laptop computers, cell phones, handheld digital devices, display panels, instrumentation, etc. They have many advantages, including light weight and, in current technology, relatively thin size. In addition, they enjoy a low power consumption. This is very advantageous for small, portable devices that run on battery power.

FIG. 1 shows several layers of a typical prior art flat panel display 100. The prior art display 100 includes a plurality of pixel elements 150 formed as part of a pixel layer. The plurality of pixel elements 150 may be formed on a glass substrate 101. The prior art display 100 further includes rows of traces 103, 104, etc., on a first side of the plurality of pixel elements 150 and columns of traces 115, 116, etc., on a second side. The traces are on opposite sides of the pixel elements 150. By strobing or polling particular rows and columns in combination, individual pixel elements of the display may be turned on and off. For example, in the figure shown, if row trace 103 is strobed at the same time column trace 116 is strobed, the shaded pixel element 150 will be turned on. This arrangement has been in use for quite some time and does an adequate job of controlling and addressing individual pixel elements of a display.

However, there are several disadvantages to the prior art. First, in order to control each individual pixel element, the row or column traces must be strobed sequentially. For example, row 103 may be strobed and individual columns 115, 116, etc., may be simultaneously strobed in order to turn on the pixel elements in row 103. Since the rows must be multiplexed and as displays get larger, the rows are turned on for a shorter time period. As a result, a display must drive the pixel elements harder during these reduced time periods in order to achieve a desired brightness. However, there is a practical upper limit to how hard a pixel element can be driven. The reliability of a display will be affected as the pixel elements are driven harder and display heating occurs.

FIG. 2 shows a front view of a prior art flat panel display showing how the traces emanate from the sides. This is another drawback of the prior art flat panel display. The display therefore must be larger than just the viewing area, and must include area for the individual traces to be accumulated and fed off of the sides of the display. Therefore, in an application like a laptop computer, more of a nonfunctional area around the edges is needed, which increases the size of the display.

What is needed, therefore, are improvements to flat panel displays.

SUMMARY OF THE INVENTION

An interconnect adapted for use with a pixel layer of a pixel web is provided according to one embodiment of the invention. The interconnect comprises an interconnect substrate including a plurality of conductive leads and a plurality of contact vias formed on and extending from the interconnect substrate. The plurality of contact vias are formed in a predetermined pattern on the interconnect substrate and are in electrical communication with the plurality of conductive leads of the interconnect substrate. The interconnect further comprises a patterned spacer of a thickness substantially equal to a height of the plurality of contact vias. The patterned spacer includes a plurality of through-holes also formed according to the predetermined pattern and having a dimension substantially equal to a dimension of the plurality of contact vias. The interconnect substrate and the patterned spacer are capable of being assembled onto the pixel layer of a pixel web, with the patterned spacer being in a middle position and the plurality of contact vias extending through the plurality of through-holes of the patterned spacer to contact corresponding cathode portions on the pixel layer.

An interconnect adapted for use with a pixel layer of a pixel web is provided according to another embodiment of the invention. The interconnect comprises a plurality of cathodes formed in columns on said pixel layer, with a cathode of said plurality of cathodes comprising a plurality of individual cathode portions. The interconnect further comprises an interconnect substrate including a plurality of conductive leads. The interconnect further comprises a plurality of contact vias formed on and extending from the interconnect substrate, the plurality of contact vias being formed in a predetermined pattern on the interconnect substrate and being in electrical communication with the plurality of conductive leads of the interconnect substrate. The interconnect further comprises at least one driver formed on the interconnect substrate, with the at least one driver providing an electrical drive current to an associated contact via. The interconnect further comprises a patterned spacer of a thickness substantially equal to a height of the plurality of contact vias. The patterned spacer includes a plurality of through-holes also formed according to the predetermined pattern and having a dimension substantially equal to a dimension of the plurality of contact vias. The interconnect substrate and the patterned spacer are capable of being assembled onto the pixel layer of the pixel web, with the patterned spacer being in a middle position and the plurality of contact vias extending through the plurality of through-holes of the patterned spacer to contact corresponding cathode portions on the pixel layer.

A method of forming a plurality of electrical connections to a pixel layer of a pixel web is provided according to another aspect of the invention. The method comprises the step of providing an interconnect substrate, the interconnect substrate including a non-conducting face and a plurality of exposed electrical contacts formed in a predetermined pattern. The method further comprises the step of placing the interconnect substrate in contact with the pixel layer, with the plurality of exposed electrical contacts of the interconnect substrate contacting predetermined regions of the pixel layer. A plurality of conductive leads may extend from substantially any region of a backside of the pixel web.

The above and other features and advantages of the present invention will be further understood from the following description of the preferred embodiments thereof, taken in conjunction with the accompanying drawings.

DETAILED DESCRIPTION

Figure 1:
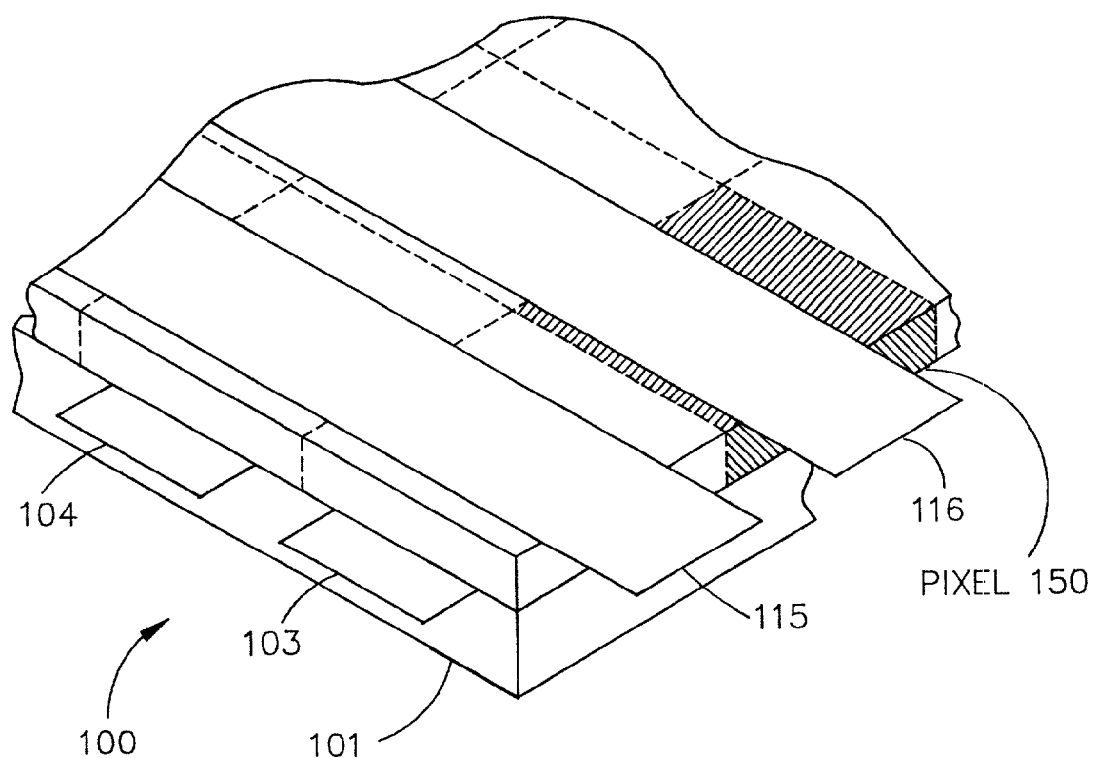
FIG. 1 shows a typical prior art flat panel display having rows of traces on a first side and columns of traces on a second side.
Figure 2:
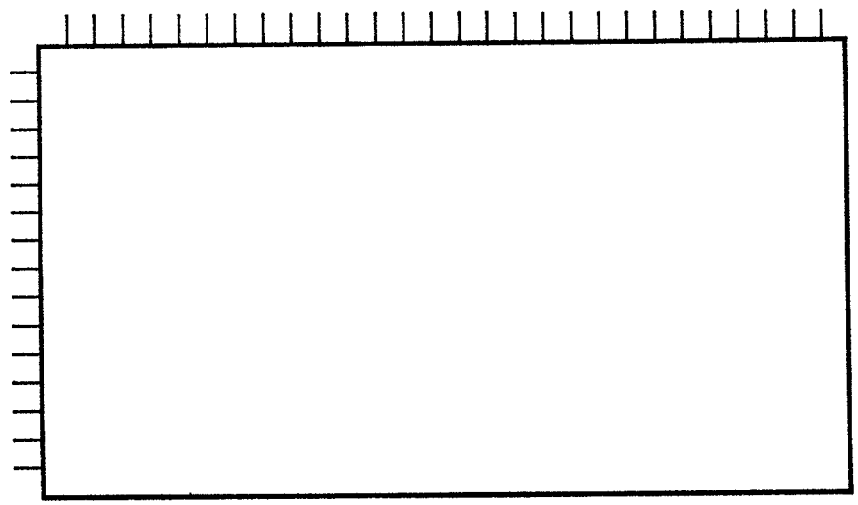
FIG. 2 shows a front view of a prior art flat panel display showing how the traces emanate from the sides.
Figure 3:
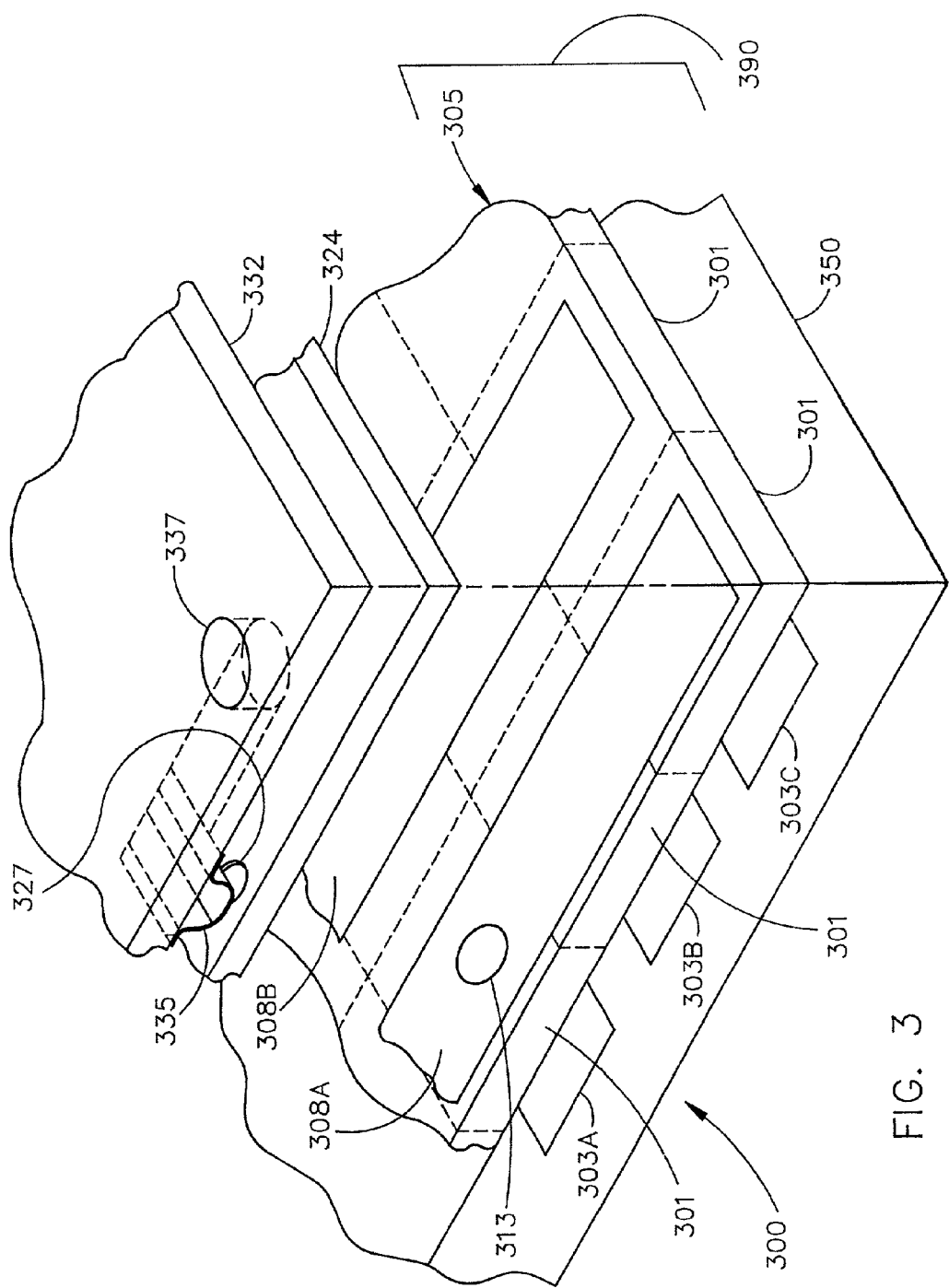
FIG. 3 shows an embodiment of an interconnect according to the invention.

FIG. 3 shows an embodiment of a display 300 according to the invention. The display 300 includes a pixel web 390 comprising at least a pixel layer 305 formed on a substrate 350. The display 300 further includes a plurality of cathodes 308 formed over emissive layers of the pixel layer 305, a patterned spacer 324, an interconnect substrate 332, and a contact via 335 or a plurality of contact vias 335 formed on the interconnect substrate 332. The substrate 350 may be any type of transparent substrate, such as a glass substrate, for example. It should be understood that although the pixel layer 305 is shown as a unitary layer, it may be comprised of multiple layers, including, for example, multiple active layers, etc. The interconnect substrate 332 and the patterned spacer 324 may be assembled to the pixel web 390 to form the display 300, and advantageously form a plurality of electrical contacts to the cathodes 308 of the pixel layer 305.

The pixel layer 305 may be a component of any type of electronic display having individually addressable pixel elements 301. For example, the pixel layer 305 could be part of a passive display or an active matrix display. This may include, for example, LEDs (light emitting diode displays), LCDs (liquid crystal displays), FEDs (field-emission displays), and plasma displays. A plurality of row traces 303 may extend from at least one edge of the pixel layer 305. A plurality of cathodes 308 form substantially vertical columns in opposition to the substantially horizontal row traces 303. The cathodes vertically interconnect columns of the pixel elements 301. It should be understood that a cathode 308 may not necessarily be continuous between the top and bottom of the display, and a cathode trace may be separated into multiple cathode portions (discussed below in conjunction with FIG. 5). The pixel layer 305 may include a plurality of cathodes 308, including multiple, vertically arranged cathode portions. Each cathode includes one or more contact areas 313.

The term column is used herein to generally designate substantially vertical cathode traces. Although the cathodes or cathode portions may be formed or viewed in any orientation, the term column is used and shown herein for simplicity and consistency.

The patterned spacer 324 in an assembled display is sandwiched between the flat panel pixel layer 305 and the interconnect substrate 332. The patterned spacer 324 separates the flat panel pixel layer 305 and the interconnect substrate 332, and may be formed of a dielectric or insulator material. The patterned spacer 324 may be formed of, but not limited to, parylene, silicon nitride, silicon oxide, silicon dioxide, carbon films and carbon-like films, etc. The patterned spacer 324 includes a plurality of through-holes 327 corresponding to the plurality of contact vias 335 of the interconnect substrate 332.

The patterned spacer 324 is preferably formed on the pixel layer 305 and on the plurality of cathodes 308, with the plurality of contact vias 335 formed therein. The interconnect substrate 332 is brought into contact with the patterned spacer 324 during final assembly. Alternatively, the patterned spacer 324 and the plurality of contact vias 335 may be formed on the interconnect substrate 332 and brought into contact with the pixel layer 305 and the cathodes 308 during assembly.

The interconnect substrate 332 may be formed of, for example, a plastic, a polymer, polyethylene terephtalate (PET), an aromatic polyimide film (generic for KAPTON), or a flexible printed circuit board material. The interconnect substrate 332 may include one or more contact vias 335 for each corresponding cathode section 308 on the pixel layer 305. As can be seen from the figure, when the interconnect substrate 332 is brought into contact with the cathodes 308, the contact vias 335 will extend through the through-holes 327 and will contact the contact regions 313 of the cathodes 308. A contact via 335 therefore establishes electrical contact between a cathode 308 and the interconnect substrate 332.

The interconnect substrate 332 additionally includes a plurality of conductive traces 337 that contact the contact vias 335 when the interconnect substrate 332 is assembled to the pixel layer 305. These conductive traces 337 may be gathered into contact pads or other types of connectors (not shown) that may be used to electrically connect the interconnect substrate 332 to drivers or other display output devices.

In addition, the interconnect substrate 332 may include a plurality of drivers or driver transistors 381 (shown and discussed below in conjunction with FIG. 4), such as thin film transistors (TFTs). These drivers or driver transistors 381 may provide an electrical drive current to one or more cathode portions 308 in order to drive pixel elements of the display.

An advantageous feature of providing the drivers 381 on the interconnect substrate 332, instead of on the pixel layer 305, is that the drivers 381 are therefore formed independently of the pixel layer 305. The drivers 381 can therefore be tested before assembly and only known good interconnect substrates having known good drivers 381 may be used. This increases the yield of the pixel layer 305 and fewer good pixel layers are wasted.

The display 300 may be formed by first depositing the spacer 324 on the pixel layer 305. The spacer 324 may be a dielectric or an insulator, such as previously described. The spacer 324 may then be turned into a patterned spacer 324 by forming a plurality of through-holes 327, with the through-holes 327 being formed in a predetermined pattern. The predetermined pattern may form through-holes 327 over the cathodes 308, with one or more through-holes 327 being formed per a continuous cathode portion (a cathode 308 may be segmented into a plurality of cathode portions, as will be discussed below in conjunction with FIG. 5). The through-holes 327 may be filled with a conductor material, such as a metal, to form the contact vias 335 that extend through the patterned spacer 324. The contact vias 335 may be, for example, gold, copper, etc., or conductive polymers.

The contact vias 335 therefore allow the interconnect substrate 332 to establish electrical connections with the pixel elements of the pixel layer 305, but without requiring extra space at the edge of the pixel layer 305. In addition, the invention allows electrical connection to the display at any region on the backside of the display. Furthermore, the invention enables multiple connections to a cathode portion, in order to reduce resistance and loss, and enables column multiplexing of the display. Column multiplexing allows a display to be infinitely large in one dimension. By employing the invention, for example, an aircraft cockpit may include a wrap-around instrumentation display of great length.

Figure 4:
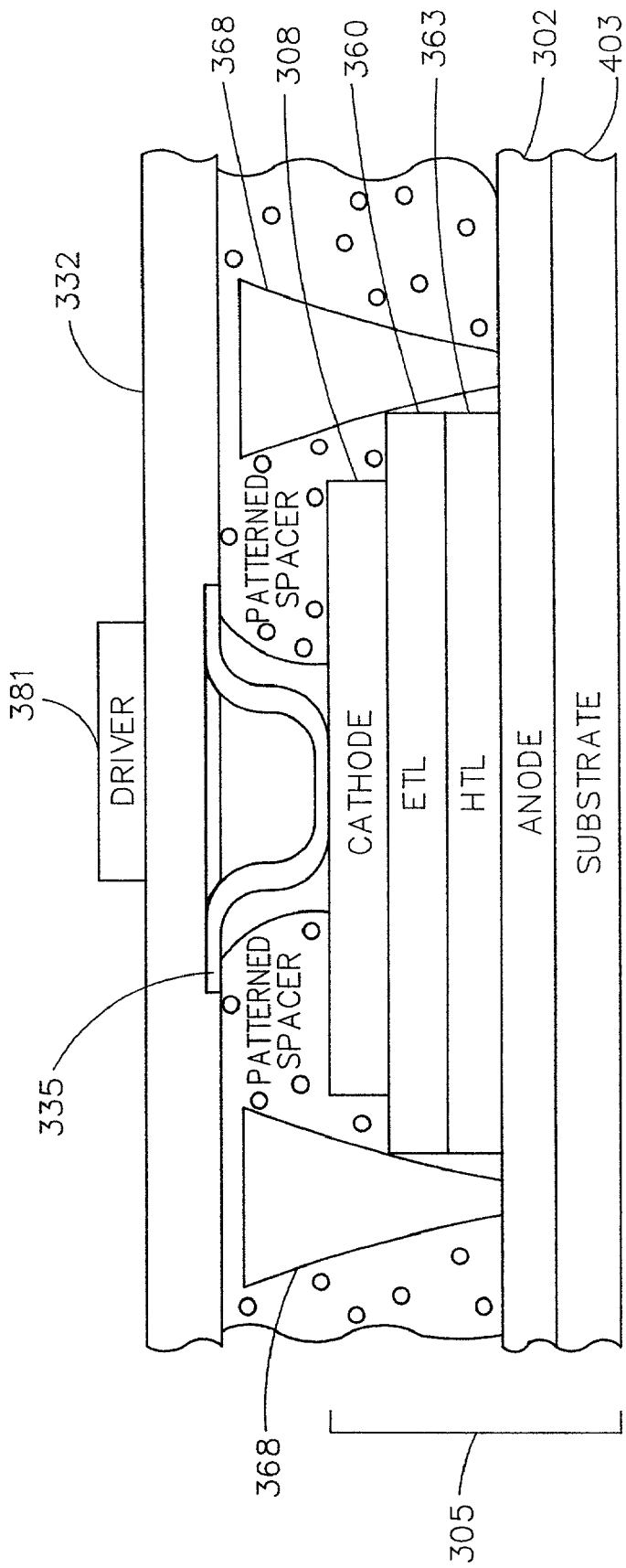
FIG. 4 shows a side view of an assembled display and interconnect substrate.

FIG. 4 shows a side view of an assembled pixel layer 305 and interconnect substrate 332. The pixel layer 305 may include, for example, an anode 302 on which is patterned the traces 303 (not shown in this figure). The pixel layer 305 may further include a hole transport layer (HTL) 363, an electron transport layer (ETL) 360, and the cathode 308. As can be seen from this figure, the contact via 335 rests on and makes electrical contact with the cathode 308. In addition, the contact via 335 is electrically connected to the interconnect substrate 332. In this manner, the contact via 335 may come into contact only with predetermined regions of the cathode strip 308.

The pixel layer 305 may further include ribs 368 (not shown in FIG. 3) that extend between cathodes 308 and interrupt the cathode 308, the electron transport layer 360, and the hole transport layer 363. The ribs 368 therefore separate pixel element columns. The ribs 368 may be formed of photoresist, and may be used during manufacture of the pixel layer 305 to set the size of the light emitting layers (i.e., the electron transport layer 360 and the hole transport layer 363).

Figure 5:
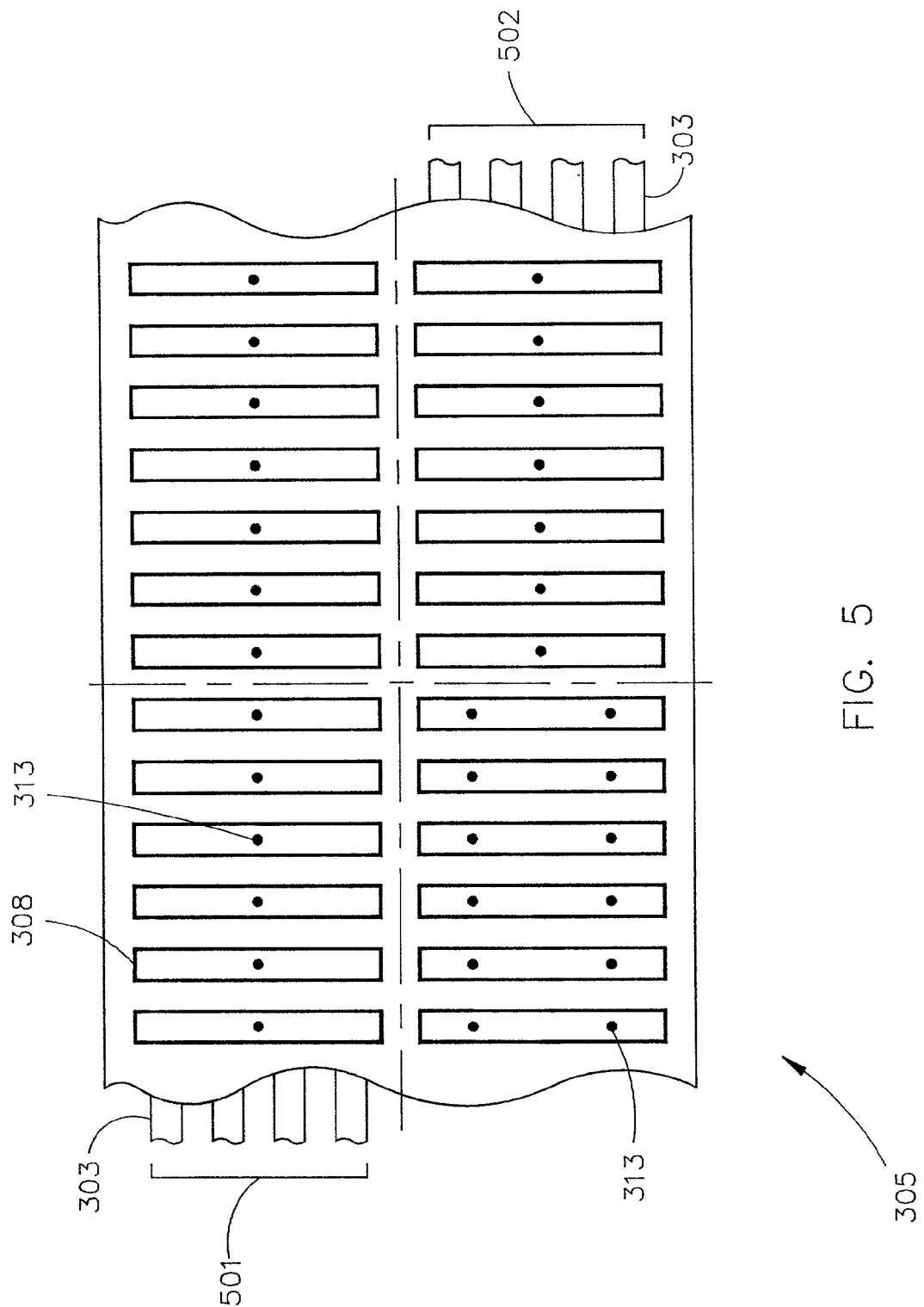
FIG. 5 shows a portion of a display having segmented column traces.

FIG. 5 shows a portion of a pixel layer 305 having segmented column traces, i.e., cathode portions 308. In the embodiment shown, the pixel layer 305 includes a column segmentation that is capable of dividing a vertical cathode into a plurality of cathode portions 308. Each cathode portion 308 is matched to a grouping of rows, such as groupings 501 and 502, for example. Any number of rows may be included in a grouping, although display efficiency will decrease with a large number of rows. It should be understood that by employing the invention, there is no upper limit to the number of cathode portions 308 in a column, and therefore there is no upper limit to the number of column segmentations in a pixel layer 305. As a result, there is no upper limit in one dimension to the size of the display.

As can be seen in this example, the columns 308 are segmented and can be individually multiplexed and driven. For example, groups of 16, 32, or 64 rows 303 may be segmented and multiplexed individually. Because the cathodes 308 may be segmented as unlimited numbers of cathode portions, the display 300 can be segmented multiple times. In contrast, a prior art display is capable of being segmented only twice (i.e., top and bottom).

The contact regions 313 are regions on the cathode portions where the contact vias 335 come into contact with the cathode 308 and are therefore regions of electrical communication. The contact regions 313 may occur anywhere within a cathode portion 308, including multiple contact regions 313 for a single cathode portion 308. If multiple contact vias 335 and corresponding multiple contact regions 313 are used for a cathode portion 308, it is preferred that they are substantially evenly distributed across the cathode portion 308. For example, the contact regions 313 may be located at the ends of a cathode portion 308 in order to improve conductance and reduce loss. In addition, when multiple contact vias 335 are formed for a cathode portion, they may be preferentially located to reduce the risk of shorting, such as being spaced according to a predetermined distribution pattern.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. An interconnect adapted for use with a pixel layer of a pixel web, comprising:
   an interconnect substrate including a plurality of conductive leads;
   a plurality of contact vias formed on and extending from said interconnect substrate, said plurality of contact vias being formed in a predetermined pattern on said interconnect substrate and being in electrical communication with said plurality of conductive leads of said interconnect substrate; and
   a patterned spacer of a thickness substantially equal to a height of said plurality of contact vias, said patterned spacer including a plurality of through-holes also formed according to said predetermined pattern and having a dimension substantially equal to a dimension of said plurality of contact vias;
   wherein said interconnect substrate and said patterned spacer are capable of being assembled onto said pixel layer of said pixel web, with said patterned spacer being in a middle position and said plurality of contact vias extending through said plurality of through-holes of said patterned spacer to contact corresponding cathode portions on said pixel layer.

2. The interconnect of claim 1, wherein said patterned spacer is formed of a dielectric material.

3. The interconnect of claim 1, wherein said patterned spacer is formed of an insulator material.

4. The interconnect of claim 1, wherein said interconnect substrate further comprises at least one driver formed as part of said interconnect substrate and providing an electrical drive current to an associated contact via.

5. The interconnect of claim 1, wherein multiple contact vias are capable of being in contact with a cathode portion of said pixel layer.

6. The interconnect of claim 1, wherein multiple contact vias are capable of being in contact with a cathode portion of said pixel layer, and wherein said multiple contact vias are spaced according to a predetermined distribution pattern.

7. The interconnect of claim 1, wherein said patterned spacer is formed on said pixel layer.

8. The interconnect of claim 1, wherein said patterned spacer is formed on said interconnect substrate.

9. The interconnect of claim 1, wherein a plurality of cathodes are formed in columns on said pixel layer, with a cathode of said plurality of cathodes comprising a plurality of individual cathode portions.

10. An interconnect adapted for use with a pixel layer of a pixel web, comprising:
    a plurality of cathodes formed in columns on said pixel layer, with a cathode of said plurality of cathodes comprising a plurality of individual cathode portions;
    an interconnect substrate including a plurality of conductive leads;
    a plurality of contact vias formed on and extending from said interconnect substrate, said plurality of contact vias being formed in a predetermined pattern on said interconnect substrate and being in electrical communication with said plurality of conductive leads of said interconnect substrate;
    at least one driver formed in said interconnect substrate, with said at least one driver providing an electrical drive current to an associated contact via; and a patterned spacer of a thickness substantially equal to a height of said plurality of contact vias, said patterned spacer including a plurality of through-holes also formed according to said predetermined pattern and having a dimension substantially equal to a dimension of said plurality of contact vias;

wherein said interconnect substrate and said patterned spacer are capable of being assembled onto said pixel layer of said pixel web, with said patterned spacer being in a middle position and said plurality of contact vias extending through said plurality of through-holes of said patterned spacer to contact corresponding cathode portions on said pixel layer.

11. The interconnect of claim 10, wherein multiple contact vias are capable of being in contact with a cathode portion of said pixel layer.

12. The interconnect of claim 10, wherein multiple contact vias are capable of being in contact with a cathode portion of said pixel layer, and wherein said multiple contact vias are spaced according to a predetermined distribution pattern.

13. The interconnect of claim 10, wherein said patterned spacer is formed on said pixel layer.

14. The interconnect of claim 10, wherein said patterned spacer is formed on said interconnect substrate.

* * * * *